United States Patent
Ko et al.

(10) Patent No.: US 9,153,687 B2
(45) Date of Patent: Oct. 6, 2015

(54) SEMICONDUCTOR DEVICE

(71) Applicant: SK hynix Inc., Gyeonggi-do (KR)

(72) Inventors: Kwang-Sik Ko, Gyeonggi-do (KR);
Kuem-Ju Lee, Gyeonggi-do (KR);
Joo-Won Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/135,011

(22) Filed: Dec. 19, 2013

(65) Prior Publication Data

US 2015/0069508 A1    Mar. 12, 2015

(30) Foreign Application Priority Data

Sep. 6, 2013    (KR) .................. 10-2013-0107448

(51) Int. Cl.
| | | |
|---|---|---|
| *H01L 29/78* | (2006.01) | |
| *H01L 29/66* | (2006.01) | |
| *H01L 29/423* | (2006.01) | |
| *H01L 29/08* | (2006.01) | |
| *H01L 21/8234* | (2006.01) | |
| *H01L 29/06* | (2006.01) | |

(52) U.S. Cl.
CPC .... *H01L 29/7816* (2013.01); *H01L 21/823418* (2013.01); *H01L 21/823425* (2013.01); *H01L 29/0615* (2013.01); *H01L 29/0873* (2013.01); *H01L 29/0878* (2013.01); *H01L 29/42368* (2013.01); *H01L 29/6659* (2013.01); *H01L 29/66492* (2013.01); *H01L 29/66659* (2013.01); *H01L 29/66674* (2013.01); *H01L 29/66681* (2013.01); *H01L 29/7833* (2013.01); *H01L 29/7835* (2013.01)

(58) Field of Classification Search
CPC ............ H01L 29/7833; H01L 29/7835; H01L 29/6659; H01L 29/66659; H01L 29/66674; H01L 29/66681; H01L 29/42368; H01L 21/823418; H01L 21/823425; H01L 29/0615; H01L 29/0873; H01L 29/0878; H01L 29/66492

See application file for complete search history.

(56) References Cited

U.S. PATENT DOCUMENTS

| | | | | |
|---|---|---|---|---|
| 5,156,989 | A | * | 10/1992 | Williams et al. ............... 438/206 |
| 5,889,315 | A | * | 3/1999 | Farrenkopf et al. ........... 257/552 |
| 7,253,476 | B2 | | 8/2007 | Fujihira |
| 7,514,754 | B2 | | 4/2009 | Ma et al. |
| 7,843,002 | B2 | | 11/2010 | Wei et al. |
| 2005/0179092 | A1 | | 8/2005 | Ko |
| 2011/0127602 | A1 | * | 6/2011 | Mallikarjunaswamy ..... 257/331 |
| 2012/0139051 | A1 | * | 6/2012 | Ranade et al. ................. 257/368 |

FOREIGN PATENT DOCUMENTS

| | | |
|---|---|---|
| KR | 1020120048824 | 5/2012 |
| KR | 101190007 | 10/2012 |

* cited by examiner

*Primary Examiner* — Fei Fei Yeung Lopez
(74) *Attorney, Agent, or Firm* — IP & T GROUP LLP

(57) ABSTRACT

A semiconductor device includes a plurality of epitaxial layers stacked over a supportive substrate, a first buried impurity region formed to share the supportive substrate with a lowermost epitaxial layer among the multiple epitaxial layers, one or more second buried impurity regions formed to be coupled with the first buried impurity region and share an $N^{th}$ epitaxial layer and an $(N+1)^{th}$ epitaxial layer among the multiple epitaxial layers, where N is a natural number, a body region formed in an uppermost epitaxial layer among the multiple epitaxial layers and a deep well formed in the uppermost epitaxial layer to surround the body region and to be coupled with the second buried impurity regions that share the uppermost epitaxial layer.

8 Claims, 6 Drawing Sheets

SEMICONDUCTOR DEVICE

CROSS-REFERENCE TO RELATED APPLICATIONS

The present application claims priority of Korean Patent Application No. 10-2013-0107448, filed on Sep. 6, 2013, which is incorporated herein by reference in its entirety.

BACKGROUND

1. Field

Exemplary embodiments of the present invention relate to a semiconductor device fabrication technology, and more particularly, to a high-voltage isolated transistor.

2. Description of the Related Art

A high-voltage isolated transistor has a great power gain and a simple gate driving circuit, compared with a general bipolar transistor. Also, latency originating from accumulation or binding of carriers does not occur during a turn-off operation of the high-voltage isolated transistor. For these reasons, the high-voltage isolated transistor is widely used for diverse power supply devices including a driving integrated circuit (IC), a power converter, a motor controller, and a vehicle power supplier.

As for the high-voltage isolated transistor, a double diffused metal-oxide silicon (DMOS) transistor using double diffusion technology, such as a lateral DMOS (LDMOS) is widely used.

SUMMARY

Various embodiments of the present invention are directed to a semiconductor device that may increase breakdown voltage and a method for fabricating the semiconductor device.

In accordance with an embodiment of the present invention, a semiconductor device may include a plurality of epitaxial layers stacked over a supportive substrate, a first buried impurity region formed to share the supportive substrate with a lowermost epitaxial layer among the multiple epitaxial layers, one or more second buried impurity regions formed to be coupled with the first buried impurity region and share an $N^{th}$ epitaxial layer and an $(N+1)^{th}$ epitaxial layer among the multiple epitaxial layers, where N is a natural number, a body region formed in an uppermost epitaxial layer among the multiple epitaxial layers and a deep well formed in the uppermost epitaxial layer to surround the body region and to be coupled with the second buried impurity regions that share the uppermost epitaxial layer.

In accordance with another embodiment of the present invention, a method for fabricating a semiconductor device may include ion-implanting an impurity into a substrate, forming a first epitaxial layer over the substrate and a first buried impurity region between the first epitaxial layer and the substrate by activating the impurity ion-implanted into the substrate, ion-implanting an impurity into the first epitaxial layer at a border contacting the first buried impurity region, forming a second epitaxial layer over the first epitaxial layer and a second buried impurity region, which contacts the first buried impurity region, between the second epitaxial layer and the first epitaxial layer by activating the impurity ion-implanted into the first epitaxial layer and forming a deep well that contacts the second buried impurity region in the second epitaxial layer.

DETAILED DESCRIPTION

Figure 1A:
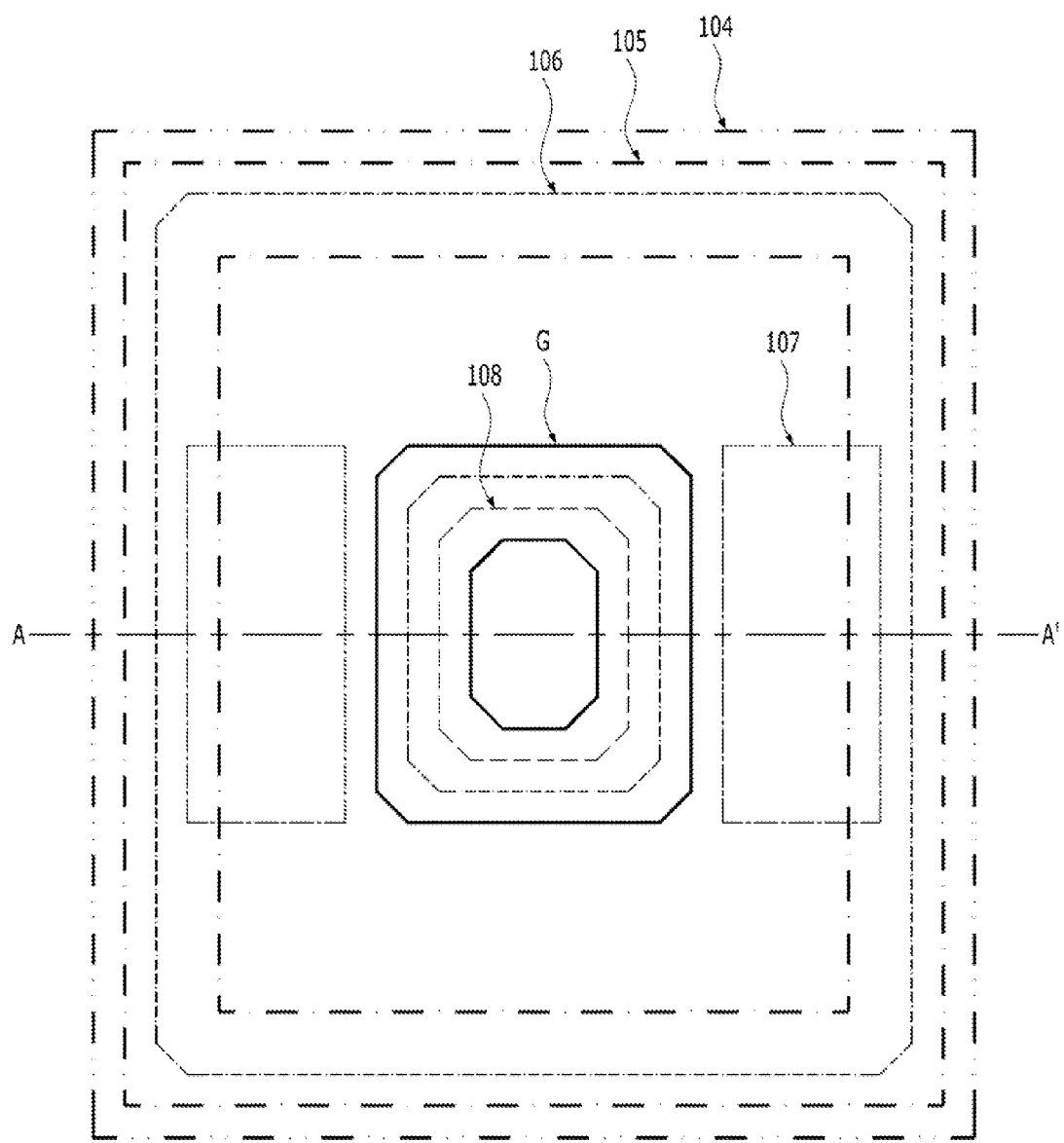
FIGS. 1A and 1B are plan and cross-sectional views illustrating a high-voltage isolated transistor in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate. For example, when a first layer is disposed over a second layer or a substrate in a multi-layer structure described in the detailed description section, it not only means a case where the first layer is directly formed on the second layer or the substrate but also means a case where one or more other layers are disposed between the first layer and the second layer or between the first layer and the substrate.

Hereafter, a high-voltage isolated transistor and a method for fabricating the high-voltage isolated transistor in accordance with an embodiment of the present invention are described.

A general high-voltage transistor is formed in an epitaxial layer doped with an impurity over a supportive substrate or a bulk substrate. The epitaxial layer is formed to be relatively thick and has low impurity doping concentration to increase the breakdown voltage of the high-voltage transistor. However, since the epitaxial layer is relatively thick and has low impurity doping concentration, a parasitic device such as a parasitic bipolar transistor, which decreases the breakdown voltage, disadvantageously operates as well. Particularly, the general high-voltage transistor, which is applied to an inductive load driving system such as an antenna or solenoid, may not secure the required breakdown voltage characteristics due to the parasitic device operating excessively for the above-described reason. To solve this concern, a high-voltage isolated transistor, which is formed on a substrate and having an isolation region surrounding the bottom surface and sidewalls of the high-voltage transistor, is suggested, but the high-voltage isolated transistor cannot secure the breakdown voltage over approximately 40V.

To solve the concern of the general high-voltage transistor and the high-voltage isolated transistor, the embodiment of the present invention may provide a high-voltage isolated transistor with an increased breakdown voltage by providing a substrate where a plurality of epitaxial layers are stacked over a supportive substrate. The high-voltage isolated transistor in accordance with the embodiment of the present invention may include one or more buried impurity regions formed between an $N^{th}$ epitaxial layer and an $(N+1)^{th}$ epitaxial layer (N is a natural number) that are contact to each other in order to prevent deterioration of isolation characteristics that may occur due to stacked structure of the plurality of epitaxial layers. The embodiment of the present invention may also provide a method for fabricating the high-voltage isolated transistor.

Hereinafter, a Lateral Double Diffused Metal Oxide Silicon (LDMOS) field effect transistor is taken as an exemplary embodiment of the present invention.

In the following description, a first conductive type and a second conductive type may be complementary to each other. For example, the first conductive type may be a P type while the second conductive type may be an N type, which is taken as an example in the following description.

Figure 1B:
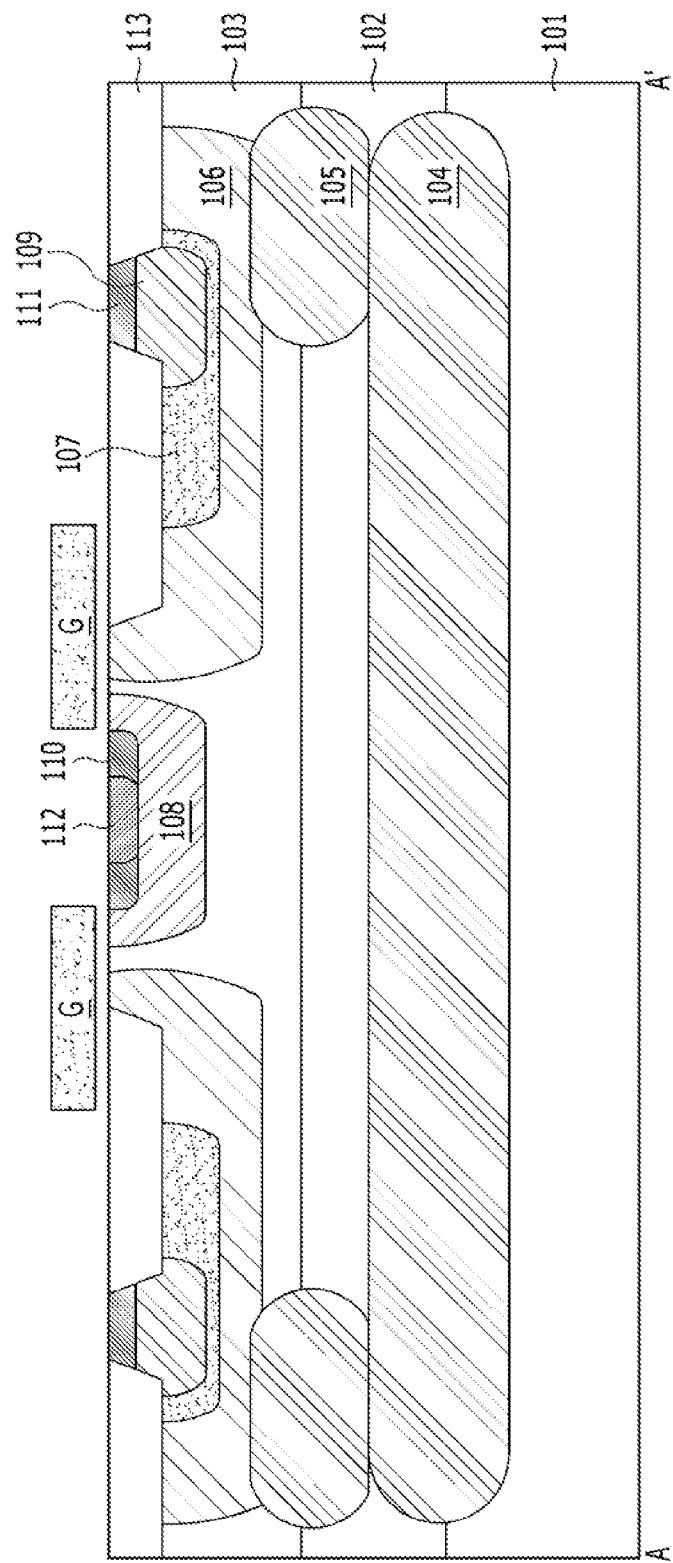

FIGS. 1A and 1B illustrate a high-voltage isolated transistor in accordance with an embodiment of the present invention. FIG. 1A is a plan view of the high-voltage isolated transistor, and FIG. 1B is a cross-sectional view of the high-voltage isolated transistor of FIG. 1A taken along an A-A' line.

Referring to FIGS. 1A and 1B, the high-voltage isolated transistor may include a plurality of epitaxial layers 102 and 103 that are stacked over a supportive substrate 101, an isolation region including a first buried impurity region 104 and one or more second buried impurity regions 105, and a transistor formed in an uppermost epitaxial layer 103 among the multiple epitaxial layers 102 and 103. For example, the transistor may be the LDMOS field effect transistor. The first buried impurity region 104 is formed between the supportive substrate 101 and a lowermost epitaxial layer 102 among the multiple epitaxial layers 102 and 103. The supportive substrate 101 and the lowermost epitaxial layer 102 are stacked and contact to each other. The one or more second buried impurity regions 105 are formed to be coupled with the first buried impurity region 104 and between an $N^{th}$ epitaxial layer and an $(N+1)^{th}$ epitaxial layer (N is a natural number) among the multiple epitaxial layers 102 and 103. The $N^{th}$ epitaxial layer and the $(N+1)^{th}$ epitaxial layer are stacked and contact to each other. When more than two second buried impurity regions 105 are formed, they may be coupled with each other. Hereafter, the constituent elements of the high-voltage isolated transistor is described.

The high-voltage isolated transistor in accordance with the embodiment of the present invention may include a substrate where the multiple epitaxial layers 102 and 103 stacked over the supportive substrate 101 are formed. The supportive substrate 101 and the multiple epitaxial layers 102 and 103 may be doped with a predetermined impurity to have the same conductive type and may include the same material.

The multiple epitaxial layers 102 and 103, which are sequentially stacked over the supportive substrate 101, may provide a sufficient space where a depletion region of the high-voltage isolated transistor may be expanded in a vertical direction so as to increase the breakdown voltage. Thickness of the multiple epitaxial layers 102 and 103 may be the same different. Impurity doping concentration of the multiple epitaxial layers 102 and 103 may be the same or different. When the multiple epitaxial layers 102 and 103 have different impurity doping concentration, the impurity doping concentration may be gradually decreased as it goes up so that the impurity doping concentration is highest in the lowermost epitaxial layer 102 and lowest in the uppermost epitaxial layer 103, which may alleviate the electric field induced in the transistor formed in the uppermost epitaxial layer, and thus further increase the breakdown voltage. The breakdown voltage may be further increased by suppressing the operation of a parasitic device.

The substrate may have a structure where the supportive substrate 101, a first epitaxial layer 102 of the first conductive type and a second epitaxial layer 103 of the first conductive type are sequentially stacked. The supportive substrate 101, the first epitaxial layer 102 and the second epitaxial layer 103 may include a semiconductor substance. The semiconductor substance may be of a monocrystalline state and may include a silicon-containing material. In other words, the semiconductor substance may include a monocrystalline silicon-containing material. For example, the supportive substrate 101 may be a bulk silicon substrate, and the first epitaxial layer 102 and the second epitaxial layer 103 may be silicon epitaxial layers. The first epitaxial layer 102 and the second epitaxial layer 103 may have the same thickness. The first epitaxial layer 102 may have higher impurity doping concentration than the second epitaxial layer 103.

Also, the high-voltage isolated transistor may include the transistor formed in the uppermost epitaxial layer 103 among the multiple epitaxial layers 102 and 103. For example, the high-voltage isolated transistor may include the transistor formed in the second epitaxial layer 103. The transistor may be the LDMOS field effect transistor. The transistor may include a gate G formed over the second epitaxial layer 103, a buried insulation layer 113 formed in the second epitaxial layer 103 to overlap a portion of the gate G, a body region 108 of the first conductive type formed in the second epitaxial layer 103 to overlap a portion of the gate G, a deep well 106 of the second conductive type formed in the second epitaxial layer 103 to surround the body region 108 and overlap a portion of the gate G, a drift region 107 of the second conductive type formed in the deep wells 106 on both sides of the body region 108, a well 109 of the second conductive type formed in the deep well 106 including the drift region 107, a drain region 111 of the second conductive type formed in the well 109 to be spaced apart from the gate G by a predetermined gap, a source region 110 of the second conductive type formed in the body region 108 to be aligned to the end of the gate G.

The gate G may be a stacked structure where a gate insulation layer and a gate electrode are stacked and the gate G may have a shape of a ring surrounding the body region 108. Although FIG. 1A illustrates the gate G of a planar type, the gate G may have diverse three-dimensional structures such as a recess type. The buried insulation layer 113 may be formed through a shallow trench isolation (STI) process.

The body region 108 may provide a channel of the high-voltage isolated transistor may be disposed in the center of the high-voltage isolated transistor. The body region 108 may have a planar shape.

The deep well 106 may have a shape of a plane including the body region 108 or a shape of a ring surrounding the body region 108. When the deep well 106 has the circular shape, the deep well 106 may contact the body region 108 or may be spaced apart from the body region 108 by a predetermined gap in the horizontal direction. When the deep well 106 is spaced apart from the body region 108 by a predetermined gap, the electric field between the deep well 106 and the body region 108 may be alleviated effectively. The deep well 106 may contact the second buried impurity regions 105 to share the second epitaxial layer 103.

The drift region 107 may provide a stable current path between the source region 110 and the drain region 111. The drift regions 107 may be disposed to be symmetrical to each other on both sides of the body region 108. The drift regions 107 may have a planar shape. The source region 110 may have a circular shape and a body pickup region 112 of the first conductive type may be disposed in the inside of the source region 110. In other words, the source region 110 may surround the body pickup region 112. The source region 110 and the body pickup region 112 may contact each other in the horizontal direction. The drain region 111 may be disposed to be symmetrical on both sides of the body region 108.

Also, the high-voltage isolated transistor may include an isolation region, which includes the first buried impurity region 104 and one or more second buried impurity regions 105.

The first buried impurity region 104 may be formed to share the supportive substrate 101 with the lowermost epitaxial layer 102 among the multiple epitaxial layers 102 and 103. The second buried impurity regions 105 may be formed to be coupled with the first buried impurity region 104 and between an $N^{th}$ epitaxial layer and an $(N+1)^{th}$ epitaxial layer (where N is a natural number) among the multiple epitaxial layers 102 and 103. The first buried impurity region 104 and the second buried impurity regions 105 may be of the same conductive type. For example, the first buried impurity region 104 and the second buried impurity regions 105 may have the second conductive type. The first buried impurity region 104 and the second buried impurity regions 105 may function as the isolation region of the high-voltage isolated transistor so as to suppress the operation of the parasitic device and thereby increase the breakdown voltage. The one or more second buried impurity regions 105 may connect the first buried impurity region 104 with a well structure 109 of the uppermost epitaxial layer 103, e.g., the deep well 105, according to the height of both of the multiple epitaxial layers 102 and 103. In other words, with the second buried impurity regions 105, the high-voltage isolated transistor may have an isolation region having excellent isolation characteristics.

The first buried impurity region 104 may share the first epitaxial layer 102 with the supportive substrate 101 and the second buried impurity regions 105 may share the second epitaxial layer 103 with the first epitaxial layer 102. The first buried impurity region 104 may have a planar shape. The second buried impurity regions 105 may have a circular shape surrounding the border of the first buried impurity region 104. The second buried impurity regions 105 may contact the border of the first buried impurity region 104. The second buried impurity regions 105 contacting the deep well 106 may overlap a portion of the drift region 107 including the drain region 111. The second buried impurity regions 105 may be disposed to overlap only outer part of the buried insulation layer 113, which contacts the drain region 111 in the horizontal direction. The second buried impurity regions 105 may be disposed not to overlap inner part of the buried insulation layer 113, which overlaps the gate G, in the horizontal direction. The second buried impurity regions 105, which is disposed to overlap only outer part of the buried insulation layer 113 and the drain region 111 and not to overlap inner part of the buried insulation layer 113 overlapping the gate G, may avoid excessive overlap between the drain region 111 and the second buried impurity regions 105 that may deteriorate the breakdown voltage.

Figure 2:
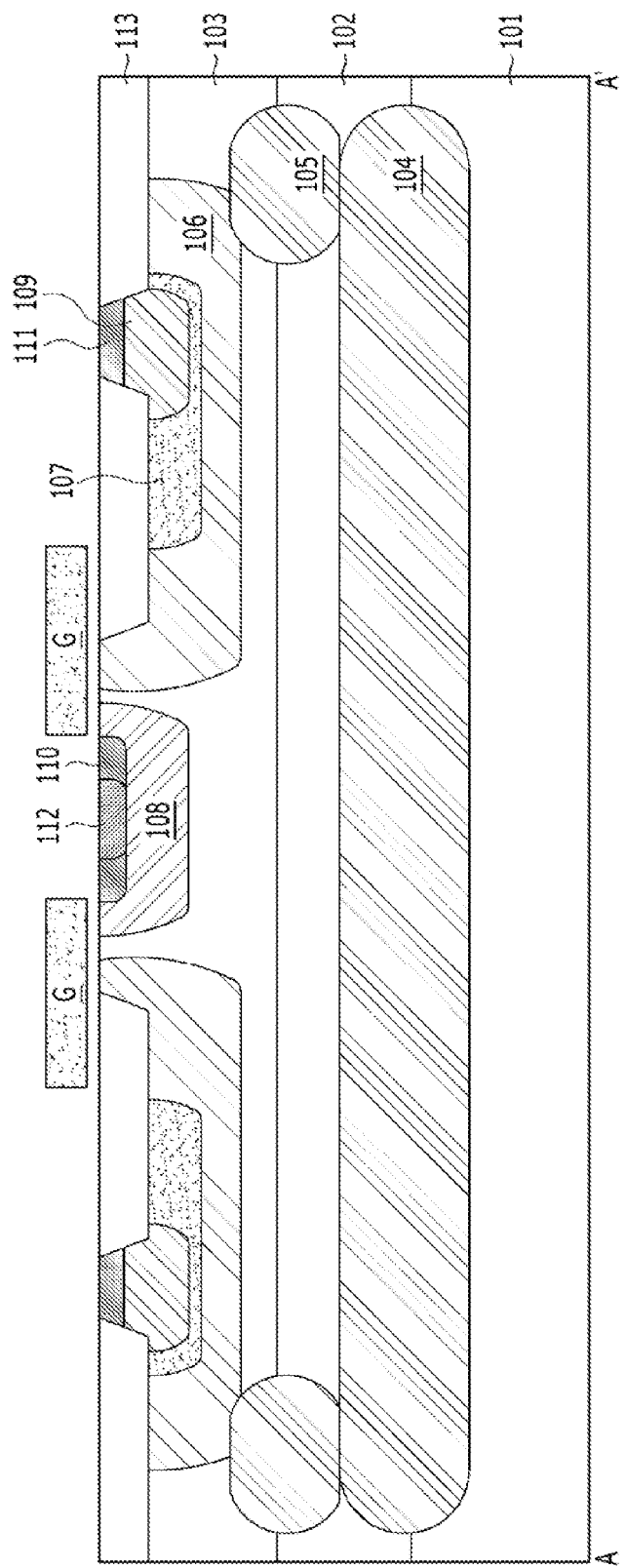
FIG. 2 is a cross-sectional view illustrating a high-voltage isolated transistor in accordance with an embodiment of the present invention.

FIG. 2 is a cross-sectional view illustrating a high-voltage isolated transistor in accordance with an embodiment of the present invention.

Referring to FIG. 2, the second buried impurity regions 105 of the high-voltage isolated transistor may be disposed not to overlap the inner part of the buried insulation layer 113 overlapping the gate G and the drain region 111. In accordance with the embodiment of the present invention, the high-voltage isolated transistor may completely prevent deterioration of the breakdown voltage originating from the overlapping between the drain region 111 and the second buried impurity regions 105. Moreover, since the high-voltage isolated transistor in accordance with the embodiment of the present invention provides the expanded depletion region expanded in the horizontal direction, the breakdown voltage may be raised more effectively.

According to the embodiments of the present invention, the breakdown voltage of the high-voltage isolated transistor may be effectively improved as the high-voltage isolated transistor includes the multiple epitaxial layers 102 and 103 and the second buried impurity regions 105.

Hereafter, a method for fabricating the high-voltage isolated transistors having the structures illustrated in FIGS. 1A and 1B is described with reference to FIGS. 3A to 3D.

FIGS. 3A to 3D are cross-sectional views illustrating a method for fabricating a semiconductor device in accordance with an embodiment of the present invention. FIGS. 3A to 3D are cross-sectional views of the semiconductor device taken along a line A-A' shown in FIG. 1A.

Figure 3A:
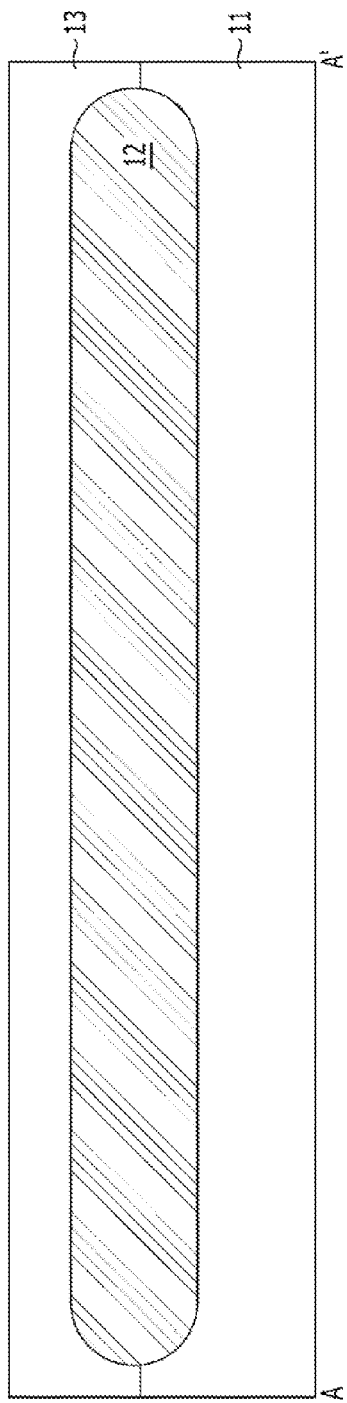
FIGS. 3A to 3D are cross-sectional views illustrating a method for fabricating a semiconductor device in accordance with an embodiment of the present invention.

Referring to FIG. 3A, a supportive substrate 11 of the first conductive type is prepared. The supportive substrate 11 may be a semiconductor substrate. The semiconductor substrate may be of a monocrystalline state and may include a silicon-containing material. In short, the semiconductor substrate may include a monocrystalline silicon-containing material. For example, the supportive substrate 11 may be a P-type bulk silicon substrate.

Subsequently, an impurity of a second conductive layer may be ion-implanted into the supportive substrate 11 through a mask pattern (not shown) as an ion implantation barrier. In other words, an N-type impurity, which is at least one impurity selected from the group consisting of phosphorus (P), arsenic (As), and antimony (Sb), is ion-implanted into the supportive substrate 11.

Subsequently, a first epitaxial layer 13 of the first conductive type is formed over the supportive substrate 11. The impurity doping concentration of the first epitaxial layer 13 may be higher than that of the supportive substrate 11. The first epitaxial layer 13 may be formed through an epitaxial growth and may include the silicon-containing material. The first epitaxial layer 13 may be doped with a P-type impurity by implanting the P-type impurity into a chamber as soon as the first epitaxial layer 13 is formed. The P-type impurity may be boron (B). In short, the first epitaxial layer 13 may be a P-type silicon epitaxial layer.

Activation energy provided in the course of forming the first epitaxial layer 13, for example, heat energy, may activate the impurity of the second conductive type implanted into the supportive substrate 11 so as to form a first buried impurity region 12 of the second conductive type. The first buried impurity region 12 may be shared by the first epitaxial layer 13 and the supportive substrate 11 and may have a planar shape.

Separately, an annealing process for forming the first buried impurity region 12 may be performed before and/or after the first epitaxial layer 13 is formed. The annealing process may be performed in a furnace.

Figure 3B:
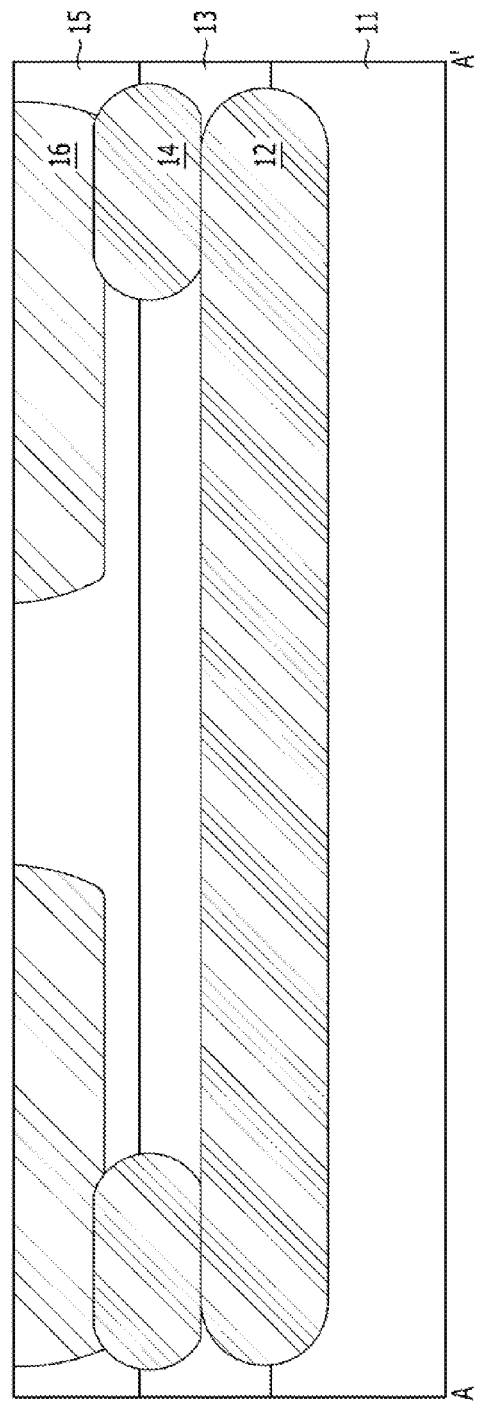

Referring to FIG. 3B, an impurity of the second conductive type may be ion-implanted into the first epitaxial layer 13 at the border contacting the first buried impurity region 12 through a mask pattern (not shown) disposed over the first epitaxial layer 13 as an ion implantation barrier.

Subsequently, a second epitaxial layer 15 of the first conductive type may be formed over the first epitaxial layer 13. The impurity doping concentration of the second epitaxial layer 15 may be lower than that of the first epitaxial layer 13. The second epitaxial layer 15 may be formed through the epitaxial growth and include a silicon-containing material.

The second epitaxial layer 15 may be doped with an impurity of the first conductive type, which may be a P-type impurity, by implanting the P-type impurity into a chamber as soon as the second epitaxial layer 15 is formed. The P-type impurity may be boron (B). In short, the second epitaxial layer 15 may be a P-type silicon epitaxial layer.

Activation energy provided in the course of forming the second epitaxial layer 15, for example, heat energy, may activate the impurity of the second conductive type implanted into the first epitaxial layer 13 so as to form a second buried impurity region 14 of the second conductive type. The second buried impurity region 14 may be shared by the second epitaxial layer 15 and the first epitaxial layer 13, may contact the border of the first buried impurity region 12 and have a circular shape.

Separately, an annealing process for forming the second buried impurity region 14 may be performed before and/or after the second epitaxial layer 15 is formed. The annealing process may be performed in a furnace.

Subsequently, a deep well 16 of the second conductive type contacting the second buried impurity region 14 may be formed in the second epitaxial layer 15. The deep well 16 may be formed by ion-implanting an impurity of the second conductive type into the second epitaxial layer 15 through a mask pattern (not shown) disposed over the second epitaxial layer 15 as an ion-implantation barrier and performing an annealing process for activating the implanted impurity. The annealing process may be performed in a furnace. The deep well 16 may be formed in the circular shape to have its external border contacting the second buried impurity region 14.

Figure 3C:
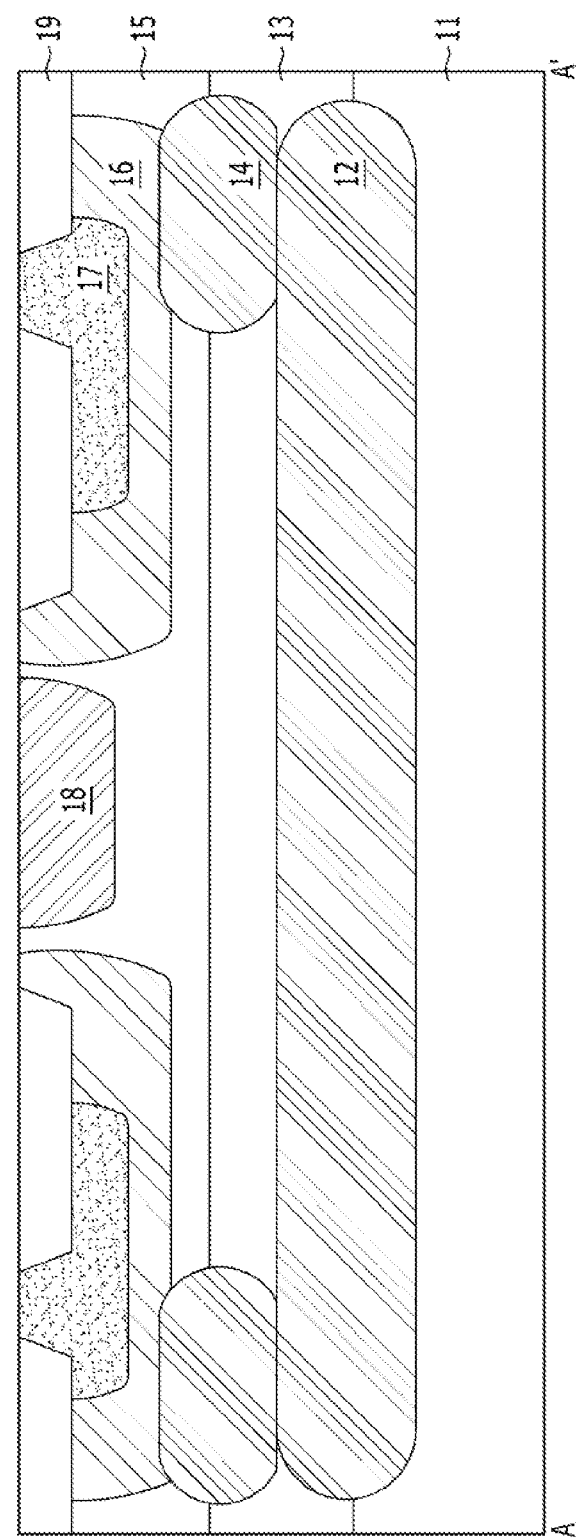

Referring to FIG. 3C, a body region 18 of the first conductive type may be formed in the second epitaxial layer 15. The body region 18 may be formed by ion-implanting an impurity of the first conductive type into the second epitaxial layer 15 through a mask pattern (not shown) disposed over the second epitaxial layer 15 as an ion-implantation barrier and performing an annealing process for activating the implanted impurity. The annealing process may be a rapid thermal process. The body region 18 may have a planar shape and may be disposed in the inside of the deep well 16 having the circular shape. The body region 18 and the deep well 16 may be formed to be spaced apart from each other by a predetermined gap.

Subsequently, a drift region 17 of the second conductive type may be formed in the deep well 16. The drift region 17 may be formed by ion-implanting an impurity of the second conductive type into the deep wells 16 on both sides of the body region 18 through a mask pattern (not shown) disposed over the second epitaxial layer 15 as an ion-implantation barrier and performing an annealing process for activating the implanted impurity. The annealing process may be performed in a furnace. The drift region 17 may have a planar shape.

Subsequently, a plurality of buried insulation layers 19 may be formed in the second epitaxial layer 15. The buried insulation layers 19 may be formed through the shallow trench isolation (STI) process. The STI process is a process of forming trenches and gap-filling the trenches with an insulating material. A portion of the buried insulation layers 19 may be formed in the inside of the deep well 16 including the drift region 17.

Figure 3D:
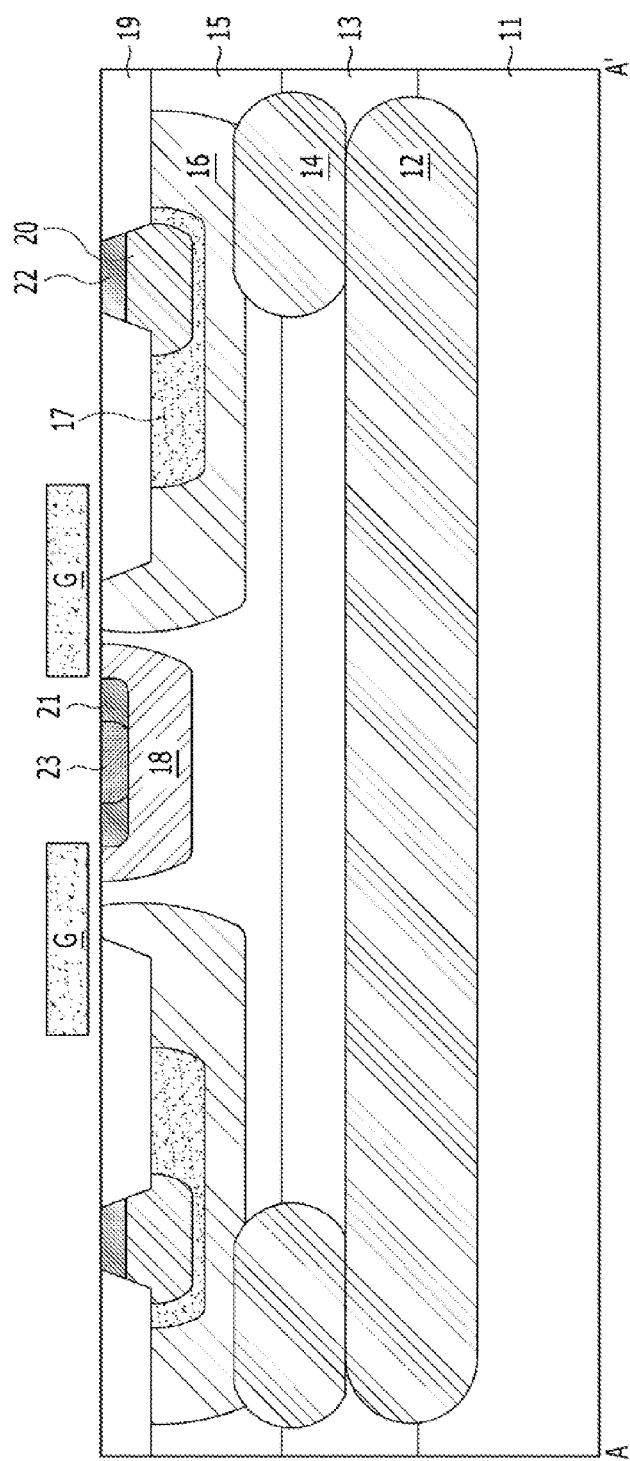

Referring to FIG. 3D, a well 20 of the second conductive type may be formed in the deep well 16 including the drift region 17. The well 20 may be formed by sequentially performing an ion-implantation process and an annealing process. The well 20 may have a circular shape, which is the same as the deep well 16.

Subsequently, a gate G may be formed over the second epitaxial layer 15. The gate G may be a stacked structure where a gate insulation layer and a gate electrode are sequentially stacked. The gate G may be formed to overlap a portion of the body region 18, a portion of the drift region 17 and a portion of the buried insulation layer 19. The gate G may have a circular shape.

Subsequently, a source region 21 of the second conductive type, a drain region 22 of the second conductive type and a body pickup region 23 of the first conductive type may be formed. The source region 21 and the body pickup region 23 may be formed in the body region 18 and the drain region 22 may be formed in the well 20. The source region 21, the drain region 22 and the body pickup region 23 may be formed by sequentially performing an ion-implantation process and an annealing process.

According to the method for fabricating the high-voltage isolated transistor in accordance with the embodiment of the present invention, when fabricating the isolation region of the high-voltage isolated transistor having a substrate of a plurality of stacked epitaxial layers for increasing the breakdown voltage, the isolation region may have excellent isolation characteristics not only on the bottom of the high-voltage isolated transistor but also in the sides of the high-voltage isolated transistor by forming the second buried impurity region 14 when the epitaxial layers are formed.

In accordance with an embodiment of the present invention, the breakdown voltage of a high-voltage isolated transistor may be effectively improved by forming a plurality of epitaxial layers and at least one second buried impurity region.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
a plurality of epitaxial layers stacked over a substrate;
a first buried impurity region formed to share the substrate with a lowermost epitaxial layer among the plurality of the epitaxial layers;
one or more second buried impurity regions formed to be coupled with the first buried impurity region and formed between an $N^{th}$ epitaxial layer and an $(N+1)^{th}$ epitaxial layer among the plurality of the epitaxial layers;
a body region formed in an uppermost epitaxial layer among the plurality of the epitaxial layers;
a deep well formed in the uppermost epitaxial layer to surround the body region and to be coupled with the second buried impurity regions;
a gate formed over the uppermost epitaxial layer;
a buried insulation layer formed in the deep well; and
a drain region formed in a drift region to be spaced apart from the gate by a predetermined gap,
wherein the second buried impurity regions are disposed not to overlap the first portion of the buried insulation layer,
wherein the drain region is overlapped to the second buried impurity regions.

2. The semiconductor device of claim 1, wherein each of the plurality of the epitaxial layers is doped to have the same conductive type to one another, and
wherein impurity doping concentration of the plurality of the epitaxial layers is gradually decreased in such a manner that the lowermost epitaxial layer has the highest impurity doping concentration and the uppermost epitaxial layer has the lowest impurity doping concentration among the plurality of the epitaxial layers.

3. The semiconductor device of claim 1, wherein the first buried impurity region has a planar shape and the one or more second buried impurity regions are formed along a border of the first buried impurity region to have a circular shape.

4. The semiconductor device of claim 1, wherein the one or more second buried impurity regions are stacked and coupled with each other.

5. The semiconductor device of claim 1, wherein the deep well surrounds the body region to have a circular shape and is spaced apart from the body region by a predetermined gap.

6. The semiconductor device of claim 1, further comprising:
   a source region formed in the body region; and
   wherein the buried insulation layer has a first portion partly overlapping the gate.

7. The semiconductor device of claim 1, the first buried impurity region is formed between the substrate and the lowermost epitaxial layer that are contact to each other.

8. The semiconductor device of claim 1, the second buried impurity regions are formed between the $N^{th}$ epitaxial layer and the $(N+1)^{th}$ epitaxial layer that are contact to each other.

* * * * *